US009165676B2

(12) United States Patent
Kang (10) Patent No.: US 9,165,676 B2
(45) Date of Patent: Oct. 20, 2015

(54) SHIFT REGISTER, DRIVING METHOD THEREOF AND FLAT PANEL DISPLAY DEVICE

(71) Applicant: LG DISPLAY CO., LTD., Seoul (KR)

(72) Inventor: ChangHeon Kang, Paju (KR)

(73) Assignee: LG DISPLAY CO., LTD., Seoul (KR)

( * ) Notice: Subject to any disclaimer, the term of this patent is extended or adjusted under 35 U.S.C. 154(b) by 99 days.

(21) Appl. No.: 13/728,191

(22) Filed: Dec. 27, 2012

(65) Prior Publication Data

US 2014/0085176 A1    Mar. 27, 2014

(30) Foreign Application Priority Data

Sep. 27, 2012    (KR) ......................... 10-2012-0108137

(51) Int. Cl.
| | | |
|---|---|---|
| *G11C 19/00* | (2006.01) | |
| *G11C 19/28* | (2006.01) | |
| *G09G 3/36* | (2006.01) | |
| *G09G 3/32* | (2006.01) | |

(52) U.S. Cl.
CPC .............. *G11C 19/28* (2013.01); *G09G 3/3611* (2013.01); *G09G 3/3677* (2013.01); *G09G 3/3225* (2013.01); *G09G 2310/0286* (2013.01)

(58) Field of Classification Search
None
See application file for complete search history.

(56) References Cited

U.S. PATENT DOCUMENTS

| 8,049,704 B2 * | 11/2011 | Jang et al. ...................... 345/100 |
| 2006/0146978 A1 * | 7/2006 | Jang ................................ 377/64 |
| 2010/0158187 A1 | 6/2010 | Moon et al. |
| 2011/0007040 A1 * | 1/2011 | John et al. ...................... 345/204 |
| 2012/0092311 A1 * | 4/2012 | Ohkawa et al. ................ 345/204 |
| 2014/0091997 A1 * | 4/2014 | Han et al. ......................... 345/92 |
| 2014/0152629 A1 * | 6/2014 | So et al. .......................... 345/205 |
| 2014/0168181 A1 * | 6/2014 | Furuta et al. ................... 345/205 |

FOREIGN PATENT DOCUMENTS

| KR | 20070065770 A | 6/2007 |
| KR | 20080048686 A | 6/2008 |
| KR | 20090073966 A | 7/2009 |
| KR | 102010071389 A | 6/2010 |
| TW | 480822 | 3/2002 |
| TW | 525139 | 3/2003 |
| TW | I247313 | 1/2006 |
| TW | 200735114 | 9/2007 |

OTHER PUBLICATIONS

Office Action issued in corresponding Korean Patent Application No. 10-2012-0108137, mailed Apr. 30, 2014, 4 pages.
Notice of Allowance issued in Korean Patent Application No. 10-2012-0108137, mailed Oct. 29, 2014, 2 pages.
Office Action dated Mar. 20, 2015 for corresponding Taiwanese Application No. 101149351, 11 pages.

* cited by examiner

*Primary Examiner* — Tuan T Lam (74) *Attorney, Agent, or Firm* — Brinks Gilson and Lione (57) ABSTRACT

A shift register includes a plurality of stages each having a pull-up transistor, a pull-down transistor and a flip-flop, the plurality of stages outputting high level output voltages sequentially for one horizontal period in response to at least one clock signal and a start signal, and an AH control circuit connected to input terminals and output terminals of the plurality of stages to control output signals of all the stages into a high level for one frame.

11 Claims, 7 Drawing Sheets

SHIFT REGISTER, DRIVING METHOD THEREOF AND FLAT PANEL DISPLAY DEVICE

CROSS-REFERENCE TO RELATED APPLICATION

Pursuant to 35 U.S.C. §119(a), this application claims the benefit of earlier filing date and right of priority to Korean Application No. 10-2012-0108137, filed on Sep. 27, 2012, the contents of which is incorporated by reference herein in its entirety.

BACKGROUND

1. Field of the Disclosure

This specification relates to a shift register, and particularly, to a shift register configuring a gate driver, which is disposed in a flat panel display device such as an organic light emitting diode device to sequentially drive each pixel, a driving method thereof, and a flat panel display device.

2. Background of the Disclosure

Examples of flat panel display (FPD) devices that substitute for cathode ray tube (CRT) display devices, include a liquid crystal display (LCD) device, a field emission display (FED) device, a plasma display panel (PDP) device, an organic light emitting diode (OLED) device, which may be referred to as an organic electroluminescent display (OELD) device, and the like.

Among others, the OLED device has characteristics of high luminance and low operation voltage, and also are self-light emitting devices of generating light by themselves so as to exhibit a high contrast ratio and implement a display with a very thin profile. Also, the OLED device has a fast response time of about several micro seconds (μs), as compared with LCD devices, so as to easily implement a moving picture. The OLED device has additional advantages of an unlimited viewing angle and stability at low temperature.

The OLED device is a current driving type, which represents a gradation of an image by controlling a current which flows on an organic light emitting diode (OLED) disposed on a display panel. In the current driving type, a spot defect (e.g., mura) is caused due to deviations of characteristics of driving transistors for controlling OLEDs. Accordingly, a separate compensation circuit is generally mounted within the display panel to compensate for the characteristic deviation for each driving transistor. The compensation circuit is a sequential compensation type in which pixels on the same horizontal line are driven after being sequentially compensated for by one horizontal period (1h), or a simultaneous emission driving type in which every pixel on a display panel is simultaneously compensated for and driven for one frame.

In the simultaneous emission type, a gate driver which drives pixels on the display panel turns on a switching transistor of each pixel by outputting a gate output voltage (Vout) of high level (VGH) for all of the pixels, and a data driver outputs a predetermined data voltage within one frame. Then, a compensation circuit senses a current flowing through each driving transistor to determine a compensation level of the data voltage for each driving transistor.

Figure 1:
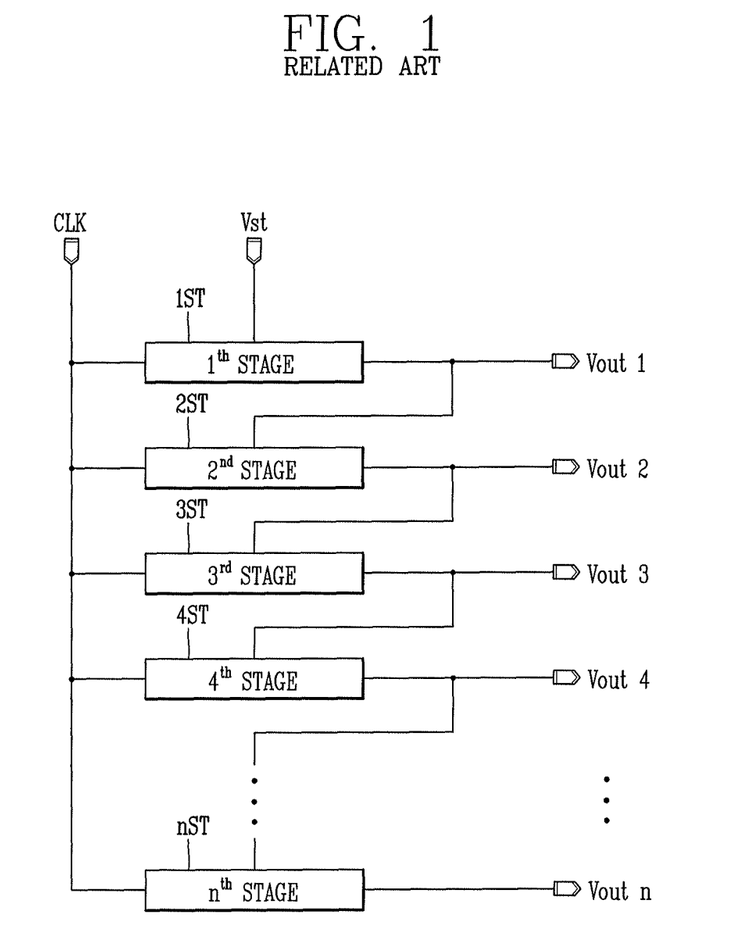
FIG. 1 is a view showing a structure of a gate driver disposed in a flat panel display device according to the related art.
Figure 2:
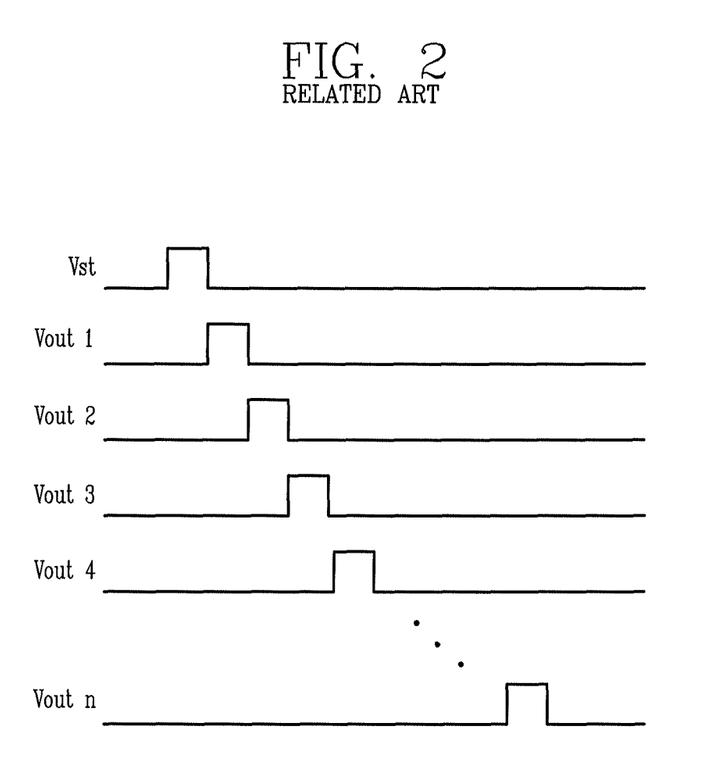
FIG. 2 is a view showing waveforms of input and output signals of the gate driver of FIG. 1.

Here, the related art gate driver, as shown in FIG. 1, includes a shift register having a plurality of stages 1ST to nST for outputting output voltages Vout to gate lines in synchronization with a clock signal CLK. With the configuration, the first stage 1ST receives a start signal Vst to output a first gate output signal Vout1 of high level for a first horizontal period 1H, and the second stage 2ST receives the first gate output signal Vout1 as the start signal Vst to output a second gate output signal Vout2 of high level. Hence, the second stage 2ST is unable to output the second gate output signal Vout2 if the first stage 1ST does not output the first gate output signal Vout1.

That is, the related art gate driver has the structure of sequentially outputting the gate output signals Vout1 to Vout n by one horizontal period (1H) for one frame. This structure, however, has a limit in that the simultaneous emission type compensation circuit cannot be applied thereto.

SUMMARY

A shift register includes a plurality of stages each having a pull-up transistor, a pull-down transistor and a flip-flop, the plurality of stages that output high level output voltages sequentially for one horizontal period in response to at least one clock signal and a start signal, and an AH control circuit connected to input terminals and output terminals of the plurality of stages to control an output signal of every stage into a high level for one frame.

There is also provided a flat panel display device including a liquid crystal panel having a plurality of gate lines and data lines intersecting with each other to define pixels on the intersecting points, a gate driver comprising a shift register mounted onto one side of the liquid crystal panel and connected to the gate lines, the shift register comprising a plurality of stages for outputting output signals of high level to the gate lines sequentially for one horizontal period, and an AH control circuit connected to input terminals and output terminals of the plurality of stages for outputting the output signals of high level to all of the gate lines for one frame, and a data driver disposed on one side of the liquid crystal panel to output a data voltage to the data lines in response to the output signals.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE EXEMPLARY EMBODIMENTS

A description will now be given in detail of a shift register and a driving method thereof according to the exemplary embodiments, with reference to the accompanying drawings. Hereinafter, the technical structure of the present disclosure will be described by illustrating one exemplary embodiment that a shift register is disposed in an organic light emitting diode (OLED) device, but the shift register according to the exemplary embodiment may also be applicable to a gate driver of another type of flat panel display device other than the OLED device.

Figure 3A:
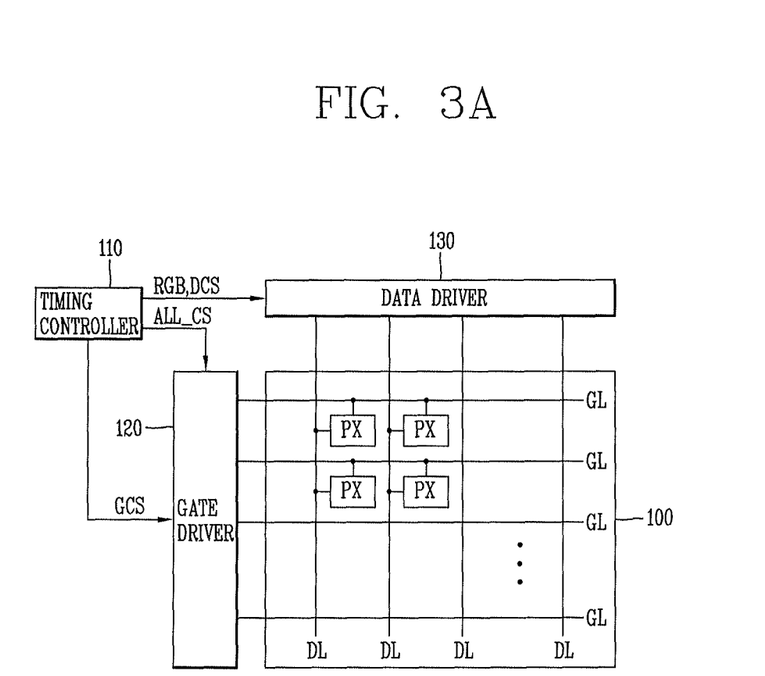
FIG. 3A is a view showing an entire structure of an organic light emitting diode (OLED) device having a shift register included in a gate driver in accordance with an exemplary embodiment.
Figure 3B:
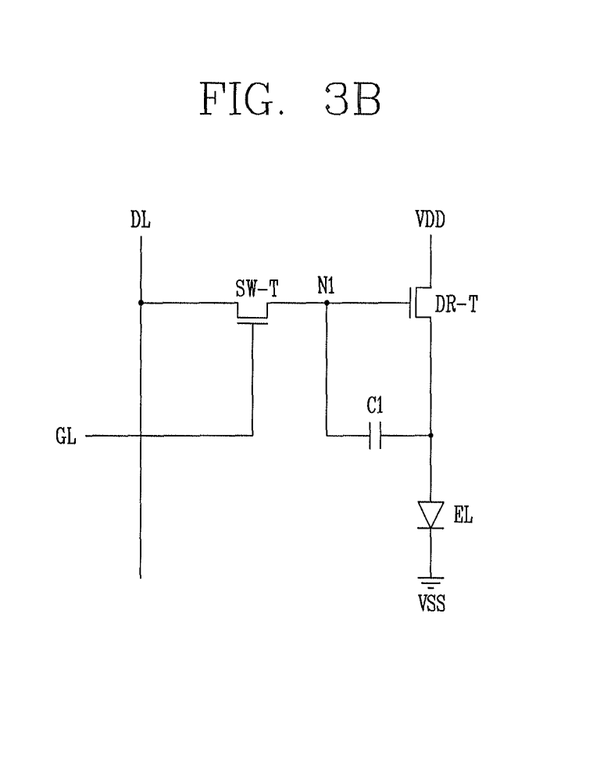
FIG. 3B is a view showing a structure of one pixel of the OLED device shown in FIG. 3A.

FIG. 3A is a view showing an entire structure of an organic light emitting diode (OLED) device having a shift register disposed in a gate driver in accordance with an exemplary embodiment, and FIG. 3B is a view showing a structure of one pixel of the OLED device shown in FIG. 3A.

As shown in FIGS. 3A and 3B, an OLED device having a shift register according to the present disclosure may include a display panel 100 for displaying an image, a timing controller 110 for generating a control signal by receiving a timing signal from an external system and aligning and converting an image signal, and a gate driver 120 for generating and outputting a gate output voltage Vout both in a sequential manner and in a simultaneous manner and a data driver 130 for generating and outputting a data voltage VDATA, under control of the timing controller 110.

The display panel 100 may include a plurality of gate lines GL and data lines DL intersecting with each other in a matrix configuration on a transparent substrate. Each of the gate lines GL may be connected to an output terminal of the gate driver 120, and each of the data lines DL may be connected to an output terminal of the data driver 130. A pixel PX may be defined on each intersecting point between the lines.

Although not shown, each pixel PX may be connected to a power supply voltage (VDD) line and a ground voltage (VSS) line which are connected to the output terminal of the data driver 130.

Each pixel PX may include at least two thin film transistors, namely, switching and driving thin film transistors (TFTs) SW-T and DR-T, an organic light emitting diode (OLED) EL and a capacitor C1.

With this configuration, in each pixel PX, the switching TFT SW-T may be turned on in response to a gate output signal input via the gate line GL, and a data voltage VDATA may be applied to a gate of the driving TFT DR-T based on a gradation such that a current corresponding to the data voltage VDATA flows on the OLED EL, thereby displaying an image.

The timing controller 110 may receive from an external system a signal RGB for an image desired to be displayed, and a timing signal, such as a horizontal synchronization signal H, a vertical synchronization signal V, a clock signal CLK for control of each driver or the like.

In response to the timing signal sent by the external system, the timing controller 100 may generate various control signals GCS and DCS for driving the gate driver 120 and the data driver 130 to be explained later, and supply the generated control signals GCS and DCS to each of the drivers 120 and 130. Also, the timing controller 110 may generate an ALL gate control signal ALL_CS for driving entire pixels PX at the same time and supply the generated ALL gate control signal ALL_CS to the gate driver 120.

Although not shown, the timing controller 110 may include therein a compensation circuit (not shown) for compensating for characteristic deviations between the driving TFTs (DR-T) of the pixels PX. The compensation circuit is driven by a simultaneous emission driving method other than a sequential driving method, and thus may compensate for the deviations of the driving TFTs DR-Ts.

The gate driver 120 may supply the gate output voltage Vout to a plurality of pixels PXs arranged on the display panel 100 in response to the gate control signal GCS input from the timing controller 110.

The gate control signal GCS may include a gate start pulse (GSP), a gate shift clock (GSC), a gate output enable signal (GOE) and the like.

The output terminal of the gate driver 120 may be connected to the gate lines GL of the display panel 100. This may allow a gate driving voltage of high level to be output sequentially by each one horizontal period 1H, thereby turning on the switching TFTs SW-Ts provided on the pixels corresponding to one horizontal line. Accordingly, the data voltage VDATA output from the data driver 130 may be applied to the driving TFT DR-T of each pixel PX.

Also, the gate driver 120 may turn on every switching TFT SW-T by outputting the gate driving voltage of high level to every gate line GL for one frame in order to compensate for the deviations of the driving TFTs DR-Ts.

The data driver 130 may arrange an image signal RGB which is input in response to the data control signal DCS input from the timing controller 110, and convert the image signal RGB into a data voltage in an analog form based on a reference voltage. The data voltage may be supplied to the display panel 100 simultaneously through every data line DL with being latched by each one horizontal period 1H.

The data control signal DCS may include a source start pulse (SSP), a source shift clock (SSC), a source output enable signal (SOE) and the like.

With the configuration of the flat panel display device having the shift register, the timing controller 110 may control the gate driver 120 and the data driver 130 in response to a timing signal supplied from an external system. Accordingly, the gate driver 120 may output a gate output signal Vout of high level to pixels sequentially by one gate line GL, and in synchronization with this, the gate driver 130 may output a data voltage VDATA via every data line DL, thereby displaying an image on the display panel 100. Here, prior to displaying the image on the display panel 100, the compensation for the deviations of the driving TFTs DR-Ts of the entire pixels PX has to be first carried out. The timing controller 110 may supply an ALL gate control signal ALL_CS to the gate driver 120 in order to sense a current flowing via the driving TFTs DR-Ts by electrically connecting every pixel PX at the beginning of an operation.

The ALL gate control signal ALL_CS may include an AH start signal Vst_AH, an AH clock signal CLK_AH, first and second floating signals FL1 and FL2 and the like. The gate driver 120 may output a gate output voltage of high level to every gate line GL for one frame, prior to generally displaying an image, thereby turning on the switching TFT SW-T of every pixel PX. Simultaneously, the data driver 130 may output a predetermined sensing voltage to every data line DL, and the compensation circuit (not shown) may sense a current flowing via the driving TFTs DR-Ts, thereby determining the deviations of each pixel. The compensation circuit may then calculate a compensation level based on the characteristic deviations of each pixel and reflect the calculated value to a data voltage for displaying an image later.

Hereinafter, a structure of a shift register in accordance with a preferred embodiment will be described with reference to the accompanying drawings.

Figure 4A:
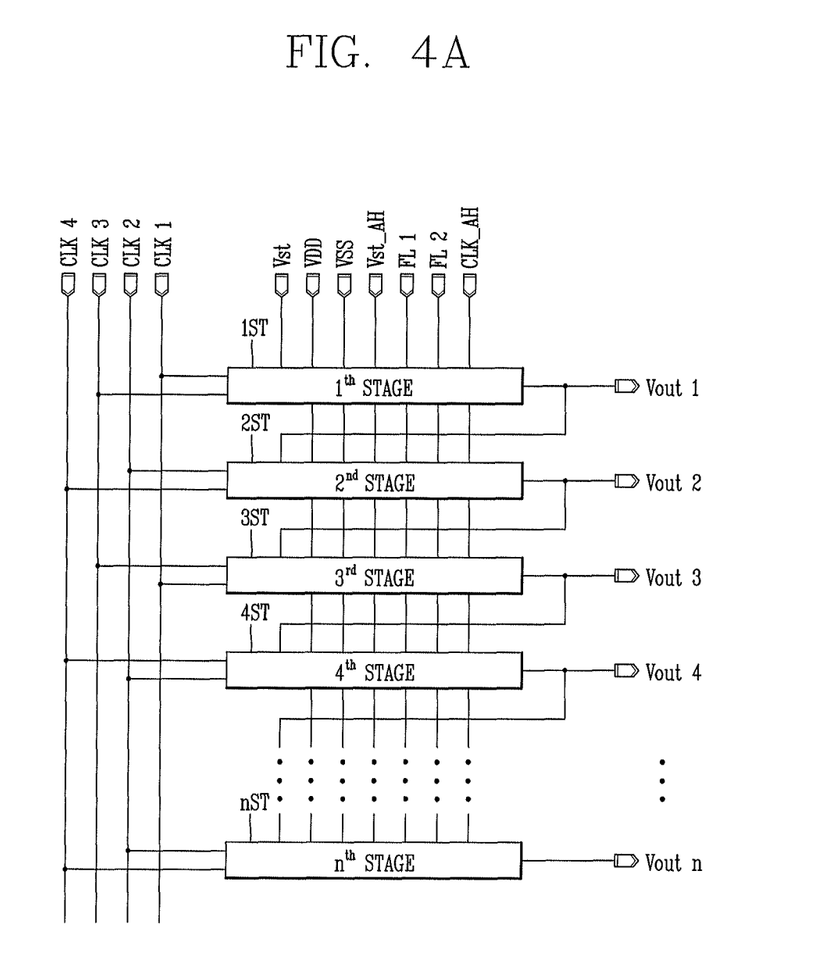
FIGS. 4A and 4B are views showing exemplary embodiments of a shift register according to the present disclosure.
Figure 4B:
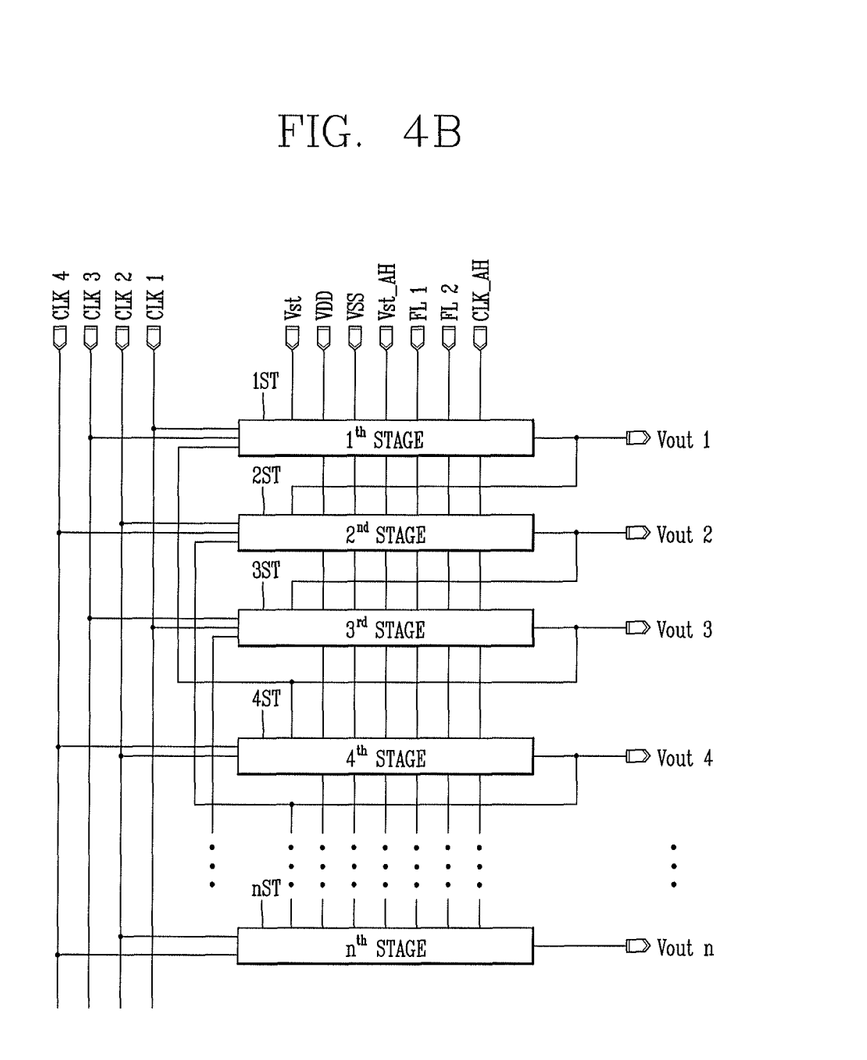

FIGS. 4A and 4B are views showing exemplary embodiments of a shift register according to the present disclosure.

As shown in FIGS. 4A and 4B, a shift register according to the present disclosure may include a plurality of stages 1ST~nST for outputting gate output voltages Vout to the gate lines in synchronization with clock signals CLK1 to CLK4.

Although not shown, the shift register may include a plurality of stages each having a pull-up transistor, a pull-down transistor and a flip-flop, and configured to sequentially output a high level output signal for one horizontal period (1H) in response to at least one clock signal and a start signal. Also, the shift register may include an AH control circuit connected to input terminals and output terminals of the plurality of stages to control the output signal of every stage into a high level for one frame.

Hereinafter, an example of a 4-phase type shift register driven by being synchronized with four clock signals CLK1 to CLK4 will be illustrated as the configuration according to the present disclosure. However, the technical scope of the present disclosure may also be applicable to a 2-phase, 3-phase or 6-phase type shift register driven by being synchronized with 2, 3 or 6 clock signals.

Also, each stage 1ST to nST may receive an AH start signal Vst_AH, an AH clock signal CLK_AH, and first and second floating signals FL1 and FL2 as well as general power supply voltage VDD and ground voltage VSS. A general start signal Vst may be input to the first stage 1ST, and gate output signals of previous stages may be input to the other stages 2ST to nST as the start signal.

FIG. 4A shows a structure that succeeding stages 2ST to nST except for the first stage 1ST receive gate output signals from preceding stages as the start signal. FIG. 4B shows a structure that the stages 3ST to nST after the second stage 2ST feedback gate output signals to the stages, which have already output the gate output signals of high level by receiving gate output signals from the stages before the previous stage, such that the current gate output signals, namely, gate output signals of low level of the corresponding stages can be stably maintained for one frame.

Although not shown, each of the stages 1ST to nST shown in FIGS. 4A and 4B, may include flip-flop, pull-up and pull-down transistors which constitute a typical shift register, and also include a plurality of transistors for floating those transistors and a transistor for controlling a gate output voltage into a high level.

Each stage 1ST to nST may float an input/output terminal of the flip-flop during a compensation period based on the AH gate control signal ALL_CS. After the compensation period, the first stage 1ST may receive a start signal Vst so as to output a first gate output signal Vout1 for one horizontal period 1H, and the second stage 2ST may receive the first gate output signal Vout1 as the start signal Vst so as to output a second gate output signal Vout2. Eventually, the nth stage nST may receive an n-1th gate output signal as the start signal so as to output the nth gate output signal Vout n for each frame.

Hereinafter, description will be given of a detailed structure of the shift register based on an equivalent circuit view of the shift register and applied signal waveforms.

Figure 5:
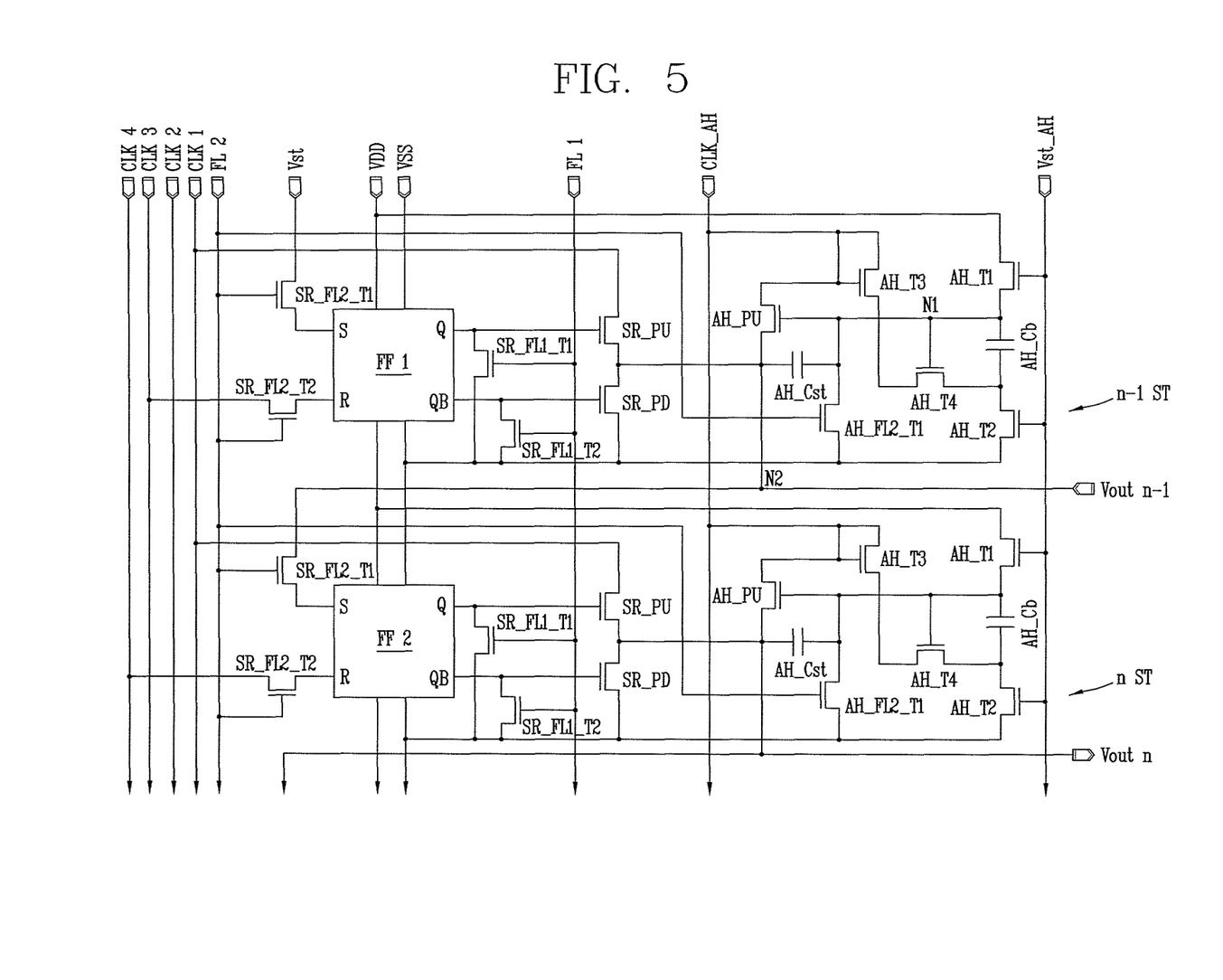
FIG. 5 is an equivalent circuit view showing two adjacent stages n-1ST and nST) of the shift register.
Figure 6:
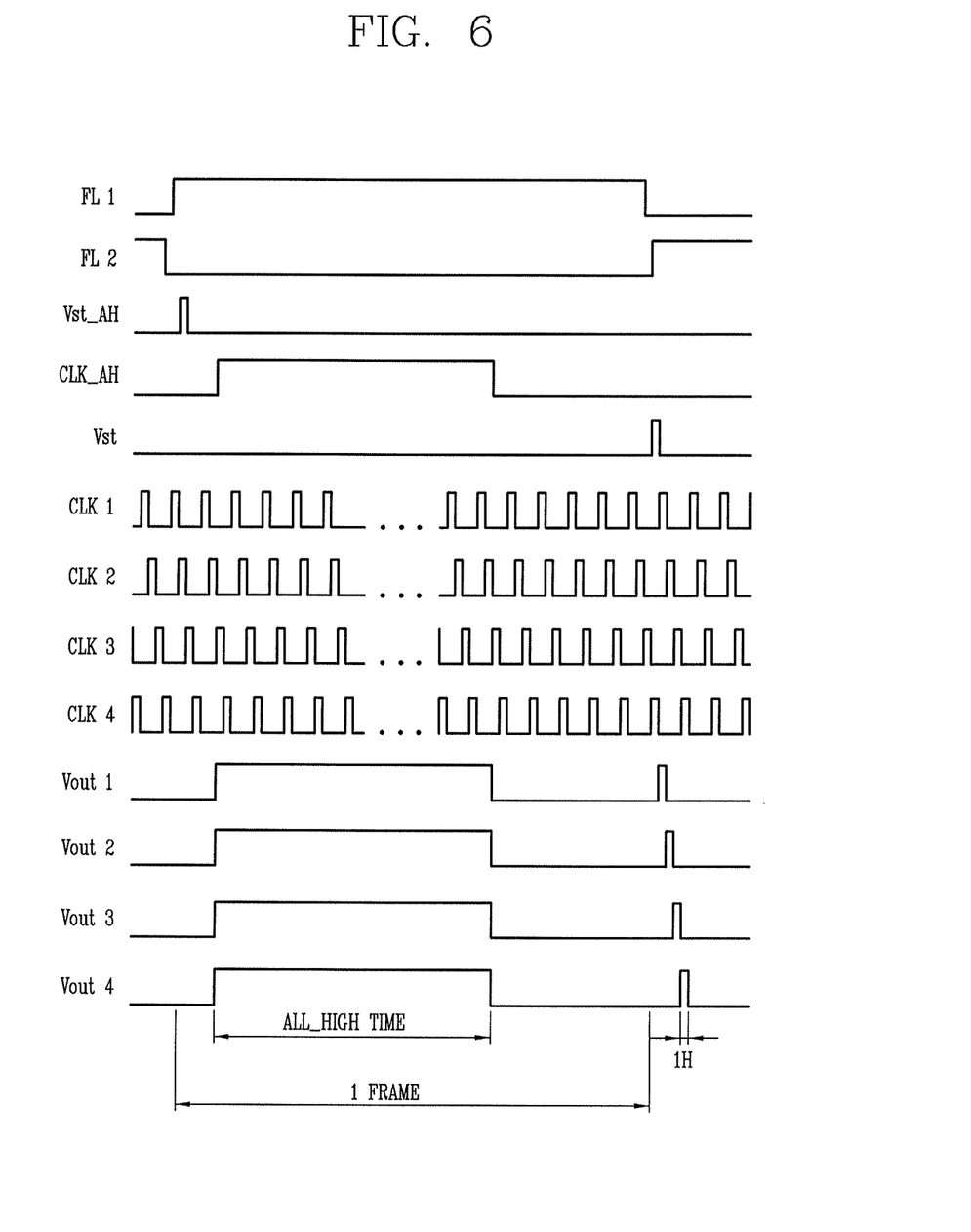
FIG. 6 is a view showing signal waveforms applied to the shift register shown in FIG. 5.

FIG. 5 is an equivalent circuit view showing two adjacent stages n-1ST and nST) of the shift register, and FIG. 6 is a view showing signal waveforms applied to the shift register shown in FIG. 5.

As shown in FIGS. 5 and 6, the shift register may include stages n-1ST and nST each configured with one pull-up TFT SR_PU, one pull-down TFT SR_PD and one flip-flop FF1, FF2, and also include first floating elements for determining output terminals of the flip-flop FF1, FF2 in response to a first floating signal FL1, second floating elements for determining input terminals into the flip-flop FF1, FF2 in response to a second floating signal FL2, and AH elements for controlling the output terminals of the plurality of stages n-1ST and nST all into a high level for one frame in response to an AH start signal Vst_AH and an AH clock signal CLK_AH.

In detail, the stages n-1ST and nST may include the corresponding flip-flop FF1 and FF2, respectively. Output terminals of each flip-flop FF1 and FF2 may be connected to the pull-up and pull-down TFTs SR_PU and SR_PD and 1-1th and 1-2th floating TFTs SR_FL1_T1 and SR_FL1_T2 as the first floating elements.

Input terminals of each flip-flop FF1 and FF2 may be connected to 2-1th and 2-2th floating TFTs SR_FL2_T1 and SR_FL2_T2 as the second floating elements.

Also, output terminals of the pull-up and pull-down TFTs SR_PU and SR_PD may be connected to an AH pull-up TFT AH_PU, first to fourth AH TFTs AH_T1, AH_T2, AH_T3 and AH_T4, an AH floating TFT AH_FL2_T1 and first and second AH capacitors AH_Cb and AH_Cst.

The first floating elements may include 1-1th and 1-2th floating TFTs SR_FL1_T1 and SR_FL1_T2. The 1-1th floating TFT SR_FL1_T1 may be connected between a gate of the pull-up TFT SR_PU and a ground voltage terminal so as to control the pull-up transistor SR_PU to maintain a turn-off state within a period where the first floating signal FL1 has a high level.

The 1-2th floating TFT SR_FL1_T2 may be connected between a gate of the pull-down TFT SR_PD and the ground voltage terminal so as to control the pull-down TFT SR_PD to maintain a turn-off state within the period where the first floating signal FL1 has a high level.

The second floating elements may include 2-1th and 2-2th floating TFTs SR_FL2_T1 and TFT SR_FL2_T2. The 2-1th floating TFT SR_FL2_T1 may be connected between a start signal (Vst) terminal or an output terminal of the previous stage n-1ST and an input terminal of the flip-flop FF1, FF2 so as to control the start signal Vst or an output signal Vout n−1 of the previous stage n-1ST to be input into the flip-flop FF1, FF2 within a period where the second floating signal FL2 has a high level.

The 2-2th floating TFT SR_FL2_T2 may be connected between a clock signal (CLK1~CLK4) terminal and the input terminal of the flip-flop FF1, FF2 so as to control the clock signals to be input into the flip-flop within a period where the second floating signal FL2 has a high level.

The AH elements may include an AH pull-up TFT AH_PU, first to fourth AH TFTs AH_T1, AH_T2, AH_T3 and AH_T4, an AH floating TFT AH_FL2_T1 and first and second AH capacitors AH_Cb and AH_Cst.

The first AH TFT AH_T1 may be connected between the first capacitor AH_Cb and the power supply voltage (VDD) terminal, and the second AH TFT AH_T2 may be connected between the first capacitor AH_Cb and the ground voltage (VSS) terminal, so as to control the first capacitor AH_Cb to be charged with a voltage level based on the difference between the power supply voltage VDD and the ground voltage VSS within a period where the AH start signal Vst_AH has a high level.

The third AH TFT AH_T3 may be diode-connected with the AH clock signal (CLK_AH) terminal, and the fourth AH TFT AH_T4 may be connected between the third AH TFT AH_T3 and the first capacitor AH_Cb. Accordingly, as the third AH TFT AH_T3 is turned on in response to an AH clock signal CLK_AH of high level being applied, the fourth AH TFT AH_T4 may bootstrap the voltage level charged in the first capacitor AH_Cst.

The AH pull-up TFT AH_PU may be connected between the third AH TFT AH_T3 and a second node N2. The AH pull-up TFT AH_PU may be turned on in response to the bootstrapped voltage applied to a first node N1 so as to output an AH clock signal CLK_AH as output signals Vout n−1 and Vout n of the stages via the second node N2.

The 1-1th AH floating TFT AH_FL_T1 may be connected between the first node N1 and the ground voltage (VSS) terminal, to apply the ground voltage VSS to the first node N1 in response to the second floating signal FL2.

The first capacitor AH_Cb may store the voltage level corresponding to the difference between the power supply voltage VDD and the ground voltage VSS and allow the bootstrapped voltage to be applied to the AH pull-up TFT AH_PU.

The second capacitor AH_Cst may be connected between the AH pull-up TFT AH_PU and the first node N1, so as to control the output signals Vout n−1 and Vout n of the stages to maintain a high level for one frame 1H.

The shift register having the aforementioned configuration may be driven as follows. First, when first to fourth clock signals CLK1 to CLK having four different phases, respectively, are applied, the second floating signal FL2 may be applied by being changed from a high level into a low level. Accordingly, the 2-1th and 2-2th floating TFTs SR_FL2_T1 and SR_FL2_T2 may be turned off. The input terminals S and R of the flip-flop FF1 may thusly be floated. Simultaneously, the AH floating TFT AH_FL2_T1 may be turned off. The gate of the AH pull-up TFT AH_PU and the first node N1 may thusly be floated.

When the first floating signal FL1 is applied after being changed from a low level into a high level, the 1-1th and 1-2th floating transistors SR_FL1_T1 and SR_FL1_T2 may be turned on and the output terminals Q and QB of the flip flop FF1, FF2 may be reset to the ground voltage VSS.

Accordingly, the pull-up and pull-down TFTs SR_PU and SR_PD may be turned off and the gate output signal Vout n−1 may be output only via the output terminal of the AH pull-up TFT AH_PU. When an AH start signal Vst_AH of high level is input within a period where the first floating signal FL1 has a high level, the first and second AH TFTs AH_T1 and AH_T2 may be turned on, thereby charging both electrodes of the first capacitor AH_Cb with levels of the power supply voltage VDD and the ground voltage VSS. Here, the voltage applied to the gate of the AH pull-up TFT AH_PU may have the level of the power supply voltage VDD and the level of the AH clock signal CLK_AH may be a low level. Therefore, the voltage level applied to the second node N2 may be a low level.

Next, when the AH start signal Vst_AH is changed into a low level, the gate of the AH pull-up TFT AH_PU may be floated. When the AH clock signal CLK_AH is changed into the high level, the diode-connected third AH TFT AH_T3 and the fourth AH TFT AH_T4 may bootstrap a voltage level of one electrode of the first capacitor AH_Cb which is maintained in the ground voltage (VSS) level. Hence, the power supply voltage (VDD) level of the other electrode of the first capacitor AH_Cb may also increase. Accordingly, the voltage level applied to the gate of the AH pull-up TFT AH_PU may become a voltage (VDD+a) level which is higher than the power supply voltage (VDD) level, thereby increasing a gate-source voltage Vgs of the AH pull-up TFT AH_PU. This may allow an AH clock signal CLK_AH of high level to be output without delay and level lowering for more than a predetermined time. Here, the output voltage may be applied to the input terminal of the next stage nST but the 2-1th floating TFT SR_FL2_T1 may be in the turn-off state. Therefore, the next stage nST may not be driven.

Afterwards, when the AH clock signal CLK_AH is changed into a low level, the gate output signal Vout n−1 may be changed into the low level. When the voltage level of the first floating signal FL1 is changed from a high level into a low level, the 1-1th and 1-2th floating TFTs SR_FL1_T1 and SR_FL1_T2 may be turned off.

When the first floating signal FL1 is a low level and the second floating signal FL2 is changed into a high level, the AH floating TFT AH_FL2_T1 may be turned on, the gate of the AH pull-up TFT AH_PU, namely, the first node N1 may be reset to the level of the ground voltage VSS, and the output terminal of the AH pull-up TFT AH_PU may be floated. Simultaneously, the 2-1th and 2-2th floating TFTs SR_FL2_T1 and SR_FL2_T2 may be turned on such that the start signal Vst can be input into the input terminal S of the flip-flop FF2 and the fourth clock signal CLK4 can be input into the input end R.

The succeeding operations are the same as in the aforementioned example. Consequently, the gate output signal Vout n of the nth stage nST may be output.

The foregoing embodiment illustrates an exemplary operation of the shift register driven with four phases, but 2-phase to 6-phase shift registers may also be applicable from the perspective of reliabilities of transistors or driving of modules.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A shift register comprising:
   a plurality of stages each having a pull-up transistor, a pull-down transistor and a flip-flop, wherein the plurality of stages output high level output voltages sequentially for one horizontal period in response to at least one clock signal and a start signal; and
   an AH control circuit connected to input terminals and output terminals of the plurality of stages to control an output signal of every stage into a high level for one frame,
   wherein the AH Control circuit comprises:
   first floating elements to determine an output terminal of the flip-flop in response to a first floating signal;

second floating elements to determine an input terminal into the flip-flop in response to a second floating signal; and AH elements to control the output terminals of the plurality of stages all into a high level for one frame in response to an AH start signal and an AH clock signal.

2. The shift register of claim 1, wherein the first and second floating signals maintain the same voltage level during a period more than one frame and are inverted signals to each other.

3. The shift register of claim 2, wherein the first floating elements comprise:
a 1-1th floating transistor connected between a gate of the pull-up transistor and a ground voltage terminal to control the pull-up transistor to maintain a turn-off state within a period where the first floating signal has a high level; and
a 1-2th floating transistor connected between a gate of the pull-down transistor and the ground voltage terminal to control the pull-down transistor to maintain the turn-off state within the period where the first floating signal has the high level.

4. The shift register of claim 2, wherein the second floating elements comprise:
a 2-1th floating transistor connected between a start signal terminal or an output terminal of a previous stage and the input terminal of the flip-flop to control the start signal or an output signal of the previous stage to be input into the flip-flop within a period where the second floating signal has a high level; and
a 2-2th floating transistor connected between a clock signal terminal and the input terminal of the flip-flop to control the clock signal to be input into the flip-flop within the period where the second floating signal has the high level.

5. The shift register of claim 2, wherein the AH elements comprise:
a first capacitor connected to a first node;
an AH floating transistor connected between the first node and the ground voltage terminal to apply a ground voltage to the first node in response to the second floating signal;
first and second AH transistors connected between the first capacitor and a power supply voltage terminal and between the first capacitor and the ground voltage terminal, respectively, to charge the first capacitor with a voltage level based on the difference between the power supply voltage and the ground voltage within a period where the AH start signal has a high level;
a third AH transistor diode-connected to an AH clock signal terminal;
a fourth AH transistor connected between the third AH transistor and the first capacitor to bootstrap the voltage level charged in the first capacitor in response to the third AH transistor being turned on;
an AH pull-up transistor connected between the third AH transistor and a second node and turned on in response to the bootstrapped voltage applied to the first node, so as to output the AH clock signal as an output signal of a corresponding stage via the second node; and
a second capacitor connected between the AH pull-up transistor and the first node.

6. The shift register of claim 1, wherein the AH clock signal has a high level period corresponding to a high level period of the output signals of the plurality of stages.

7. A method for driving a shift register comprising a plurality of stages, and an AH control circuit connected to input terminals and output terminals of the plurality of stages to control an output signal of every stage into a high level for one frame, the method comprising:
determining output terminals of flip-flops of the plurality of stages by applying a first floating signal;
determining input terminals of the flip-flops by applying a second floating signal; and
controlling the output terminals of the plurality of stages all into a high level for one frame by applying an AH start signal and an AH clock signal,
wherein the first and second floating signals maintain one voltage level during a period more than one frame and are inverted signals to each other.

8. The method of claim 7, wherein the control circuit comprises:
a 1-1th floating transistor connected between a gate of a pull-up transistor and a ground voltage terminal; and
a 1-2th floating transistor connected between a gate of a pull-down transistor and the ground voltage terminal,
wherein the method further comprises:
controlling the pull-up transistor to maintain a turn-off state by applying the first floating signal of high level; and
controlling the pull-down transistor to maintain the turn-off state.

9. The method of claim 7, wherein the control circuit comprises:
a 2-1th floating transistor connected between a start signal terminal or an output terminal of a previous stage and the input terminal of a flip-flop; and
a 2-2th floating transistor connected between a clock signal terminal and the input terminal of the flip-flop,
wherein the method further comprises:
controlling the start signal or an output signal of the previous stage to be input into the flip-flop by applying the second floating signal of high level; and
controlling the clock signal to be input into the flip-flop within the period where the second floating signal has the high level.

10. The method of claim 7, wherein the control circuit comprises:
a first capacitor connected to a first node;
an AH floating transistor connected between the first node and the ground voltage terminal;
first and second AH transistors connected between the first capacitor and a power supply voltage terminal and between the first capacitor and the ground voltage terminal, respectively;
a third AH transistor diode-connected to an AH clock signal terminal;
a fourth AH transistor connected between the third AH transistor and the first capacitor;
an AH pull-up transistor connected between the third AH transistor and a second node; and
a second capacitor connected between the AH pull-up transistor and the first node,
wherein the method further comprises:
applying a ground voltage to the first node in response to the second floating signal;
charging the first capacitor with a voltage level based on the difference between the power supply voltage and the ground voltage by applying a AH start signal of high level;
bootstrapping the voltage level charged in the first capacitor in response to the third AH transistor being turned on; and outputting a AH clock signal as an output signal of a corresponding stage via the second node in response to the bootstrapped voltage applied to the first node.

11. The method of claim 7, wherein the AH clock signal has a high level period corresponding to a high level period of the output signals of the plurality of stages.

* * * * *